United States Patent
Fong et al.

(12) 
(10) Patent No.: US 11,156,502 B2
(45) Date of Patent: Oct. 26, 2021

(54) MICROWAVE DETECTOR

(71) Applicant: RAYTHEON BBN TECHNOLOGIES CORP., Cambridge, MA (US)

(72) Inventors: Kin Chung Fong, Concord, MA (US); Leonardo Ranzani, Acton, MA (US)

(73) Assignee: Raytheon BBN Technologies Corp., Cambridge, MA (US)

(*) Notice: Subject to any disclaimer, the term of this patent is extended or adjusted under 35 U.S.C. 154(b) by 39 days.

(21) Appl. No.: 16/826,110

(22) Filed: Mar. 20, 2020

(65) Prior Publication Data

US 2020/0363267 A1 Nov. 19, 2020

Related U.S. Application Data

(60) Provisional application No. 62/848,579, filed on May 15, 2019.

(51) Int. Cl.
| | |
|---|---|
| *G01J 5/24* | (2006.01) |
| *G01J 5/06* | (2006.01) |
| *H01L 39/22* | (2006.01) |
| *G01J 5/20* | (2006.01) |

(52) U.S. Cl.
CPC . *G01J 5/24* (2013.01); *G01J 5/06* (2013.01); *H01L 39/223* (2013.01); *G01J 2005/065* (2013.01); *G01J 2005/208* (2013.01)

(58) Field of Classification Search
CPC .......... G01J 5/24; G01J 5/06; G01J 2005/065; G01J 2005/208; G01J 2005/202; H01L 39/223; H01L 39/22; G01R 29/0878; G01R 21/01; G01R 21/04
See application file for complete search history.

(56) References Cited

U.S. PATENT DOCUMENTS

| | | | |
|---|---|---|---|
| 4,424,483 A | | 1/1984 | Aslan |
| 5,204,614 A | * | 4/1993 | Szente ..................... G01R 1/24 324/652 |
| 10,461,385 B2 | * | 10/2019 | Sliwa ........................ H03F 3/60 |
| 2016/0372622 A1 | * | 12/2016 | Fong ..................... H01L 31/109 |

(Continued)

FOREIGN PATENT DOCUMENTS

WO    WO 2016/178802 A1    11/2016

OTHER PUBLICATIONS

Day, Peter K. et al., "A broadband superconducting detector suitable for use in large arrays", Letters to Nature, Oct. 23, 2003, pp. 817-821, Nature Publishing Group.

(Continued)

*Primary Examiner* — Marcus H Taningco
(74) *Attorney, Agent, or Firm* — Lewis Roca Rothgerber Christie LLP

(57) ABSTRACT

A system for detecting microwave power. In some embodiments, the system includes: a first resonator including a graphene-insulating-superconducting junction; a probe signal source, coupled to the first resonator; and a probe signal analyzer. The probe signal analyzer is configured: to measure a change in amplitude or phase of a probe signal received by the probe signal analyzer from the probe signal source, and to infer, from the change in amplitude or phase, a change in microwave power received by the graphene-insulating-superconducting junction.

20 Claims, 7 Drawing Sheets

(56) References Cited

U.S. PATENT DOCUMENTS

2017/0092834 A1* 3/2017 Fong .......... G01J 1/44
2017/0317220 A1* 11/2017 Fong .......... G01J 1/42
2018/0337324 A1 11/2018 Fong et al.

OTHER PUBLICATIONS

Walsh, Evan D. et al. "Graphene-Based Josephson-Junction Single-Photon Detector", Physical Review Applied, 2017, pp. 024022-1 through 024022-11, vol. 8, American Physical Society.

Gartner, et al., "Homodyne Network Analysis—Improving the Accuracy and Sensitivity by Redundant Phase Coding and Double Modulation", Archiv fur Elektronik Und Ubertragungstechnik, S. Hirzel Verlag. Stuttgart, DE, vol. 43, No. 1, Jan. 1, 1989 (pp. 16-22).

Karasik, et al., "Normal-Metal Hot-Electron Nanobolometer With Johnson Noise Thermometry Readout", IEEE Transactions on Terahertz Science and Technology, IEEE, Piscataway, NJ, USA, vol. 5, No. 1 Jan. 1, 2015 (pp. 16-21).

Rao, et al., "A Novel Feed for a Multifrequency Hybrid Resonator Antenna", IEEE Microwave and Wireless Components Letters, IEEE Service Center, New York, NY, US., vol. 15, No. 1, Apr. 1, 2005, (pp. 238-240).

Tarasov, et al., "Power Load and Temperature Dependence of Cold-Electron Bolometer Optical Response at 350 GHz", IEEE Transactions on Applied Superconductivity, IEEE Service Center Los Alamitos, CA, US, vol. 24, No. 6, Dec. 1, 2014 (pp. 1-5).

Tong, et al., "Asymmetric Two-Terminal Graphene Detector for Broadband Radiofrequency Heterodyne and Self-Mixing", Arxiv Org. Cornell University Library, 201 Olin Library Cornell University Ithaca, NY 14853, May 17, 2018 (26 pgs.).

Vora, "Bolometric Response in Graphene Based Superconducting Tunnel Junctions", Applied Physics Letters, A I P Publishing LLC, US., vol. 100, No. 15, Apr. 9, 2012 (pp. 153507-1-153507-6).

Vora, "Nonlinear vs. Bolometric Radiation Response and Phonon Thermal Conductance in Graphene-Superconductor Junctions", Journal of Applied Physics, American Institute of Physics, US, vol. 115, No. 7, Feb. 21, 2014 (pp. 074505-1-074505-8).

International Search Report for corresponding International Application No. PCT/US2020/026323, filed Apr. 2, 2020, International Search Report dated Jul. 20, 2020 and mailed Jul. 29, 2020 (7 pgs.).

Written Opinion of the International Searching Authority for corresponding International Application No. PCT/US2020/026323, filed Apr. 2, 2020, Written Opinion of the International Searching Authority dated Jul. 29, 2020 (8 pgs.).

* cited by examiner

MICROWAVE DETECTOR

CROSS-REFERENCE TO RELATED APPLICATION(S)

The present application claims priority to and the benefit of U.S. Provisional Application No. 62/848,579, filed May 15, 2019, entitled "FAST, FREQUENCY MULTIPLEXED READOUT FOR GRAPHENE BOLOMETER", the entire content of which is incorporated herein by reference.

FIELD

One or more aspects of embodiments according to the present invention relate to microwaves, and more particularly to a microwave detector.

BACKGROUND

Various military applications, and commercial applications, such as spectroscopy or microwave imaging applications, may make use of a microwave detector, e.g., an array detector for microwaves. Related art microwave detectors may be large or may have poor performance or high power consumption, or may otherwise be poorly suited for use in an array detector. Thus, there is a need for an improved microwave detector.

SUMMARY

According to an embodiment of the present invention, there is provided a system for detecting microwave power, the system including: a first resonator including a graphene-insulating-superconducting junction; a probe signal source, coupled to the first resonator; and a probe signal analyzer, the probe signal analyzer being configured: to measure a change in amplitude or phase of a probe signal received by the probe signal analyzer from the probe signal source, and to infer, from the change in amplitude or phase, a change in microwave power received by the graphene-insulating-superconducting junction.

In some embodiments, the first resonator includes a tank circuit.

In some embodiments, the probe signal analyzer is configured to measure a reflected probe signal, the reflected probe signal being reflected from the first resonator.

In some embodiments, the system includes a directional coupler connected to the probe signal source, the first resonator, and the probe signal analyzer, the directional coupler being configured: to transmit an incident probe signal from the probe signal source to the first resonator, and to transmit the reflected probe signal from the first resonator to the probe signal analyzer.

In some embodiments, the system further includes an amplifier between the directional coupler and the probe signal analyzer.

In some embodiments, the system further includes a circulator, between the first resonator and the amplifier.

In some embodiments, the system further includes an attenuator between the probe signal source and the directional coupler.

In some embodiments, the system further includes a bias circuit connected to the graphene-insulating-superconducting junction and configured to drive a bias current through the graphene-insulating-superconducting junction.

In some embodiments, the system further includes a bias tee, connected between the bias circuit and the graphene-insulating-superconducting junction.

In some embodiments, the system further includes a power splitter and a mixer, the power splitter being connected between the probe signal source and the first resonator, and configured to divert a portion of the probe signal from the probe signal source to a local oscillator input of the mixer, the mixer having a radio frequency input connected to the first resonator and an intermediate frequency output connected to the probe signal analyzer.

In some embodiments, the probe signal source is configured to provide an unmodulated signal at a first frequency, the first frequency being between 100 kHz and 100 GHz.

In some embodiments, the first frequency is within 10% of a resonant frequency of the first resonator when no microwave power is received by the graphene-insulating-superconducting junction.

In some embodiments, the probe signal analyzer is configured to measure a change in amplitude of the probe signal received by the probe signal analyzer from the probe signal source.

In some embodiments, the probe signal analyzer is configured: to measure a change in phase of the probe signal received by the probe signal analyzer from the probe signal source and to measure a change in amplitude of the probe signal received by the probe signal analyzer from the probe signal source.

In some embodiments, the system includes an array of resonators including the first resonator and a second resonator, wherein: the second resonator includes a graphene-insulating-superconducting junction; the first resonator has a first resonant frequency; the second resonator has a second resonant frequency different from the first resonant frequency; and the probe signal source is a multi-frequency source, configured to operate at a frequency within 10% of the first resonant frequency and at a frequency within 10% of the second resonant frequency.

In some embodiments: the graphene-insulating-superconducting junction includes a graphene sheet, and the graphene-insulating-superconducting junction is configured to receive the microwave power as current flowing from a first edge contact of the graphene-insulating-superconducting junction, through the graphene sheet, to a second edge contact of the graphene-insulating-superconducting junction.

In some embodiments, the system includes a twin slot input resonator connected to the first edge contact and to the second edge contact.

In some embodiments, the graphene-insulating-superconducting junction includes: a first layer of hexagonal boron nitride immediately adjacent a first surface of the graphene sheet, and a second layer of hexagonal boron nitride immediately adjacent a second surface of the graphene sheet.

In some embodiments, each of the first layer of hexagonal boron nitride and the second layer of hexagonal boron nitride has a thickness greater than 1 nm and less than 1 micron.

In some embodiments, the graphene sheet consists of a single atomic layer of graphene.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a microwave detector provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1A:
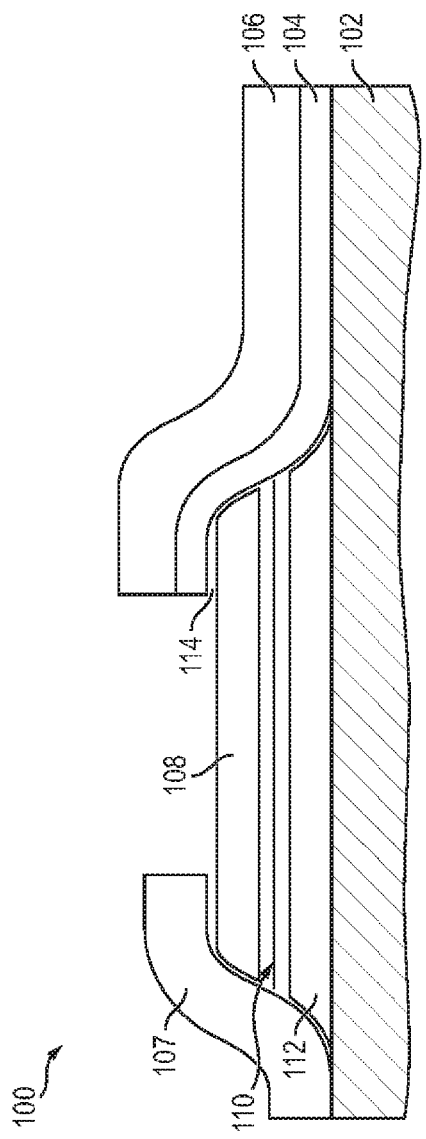
FIG. 1A is a schematic illustration of a graphene-insulating-superconducting junction, according to an embodiment of the present invention.

Referring to FIG. 1A, a graphene-insulating-superconducting junction 100 may include a graphene sheet 110 sandwiched between two layers 108, 112 of hexagonal boron nitride, and a superconducting metal layer 106, separated from the sandwich by an insulating layer 104. The superconducting metal may be superconducting aluminum, or other two-dimensional superconductors such as niobium diselenide, for example, and the insulating layer may be composed of aluminum oxide, or other two-dimensional dielectrics such as hexagonal boron nitride, for example. The graphene-insulating-superconducting junction may be constructed on a substrate 102. The thickness of each of the hexagonal boron nitride layers 108, 112 may be in the range of 1 nm to 100 nm, e.g., the thickness may be 30 nm. The thickness of graphene sheet 110 may be 1 atomic layer, or a small number of atomic layers (e.g., 2, 3, or 4 layers, or as many as 20 layers). The junction contact of the graphene edge 114 may be a one-dimensional contact or a (two-dimensional) contact made via the overlapping surface. The insulating part of the junction may be the hexagonal boron nitride or the other insulating oxide material as mentioned above.

The graphene-insulating-superconducting junction may be a two-terminal device, with one terminal being the superconducting metal layer 106 and the other terminal being the graphene sheet 110 (to which a connection may be made using, for example, an additional edge contact). In other embodiments the graphene sheet may have two or more additional edge contacts. For example, one or two edge contacts (e.g., two edge contacts 107, 109 as shown in FIG. 1C), may be used to feed the oscillating voltage and current of a microwave (or terahertz) signal (the signal to be detected) to the graphene sheet 110 for detection (one contact if the current return path is through the graphene-insulating-superconducting junction (e.g., if the signal is fed in on an unbalanced transmission line), or two contacts if the current return path is separate, e.g., if the signal is in on a balanced transmission line). The superconducting contact (or another edge contact) may be used to feed an inbound radio frequency or microwave signal to the graphene-insulating-superconducting junction to measure its differential resistance, as described in further detail below.

Figure 1B:
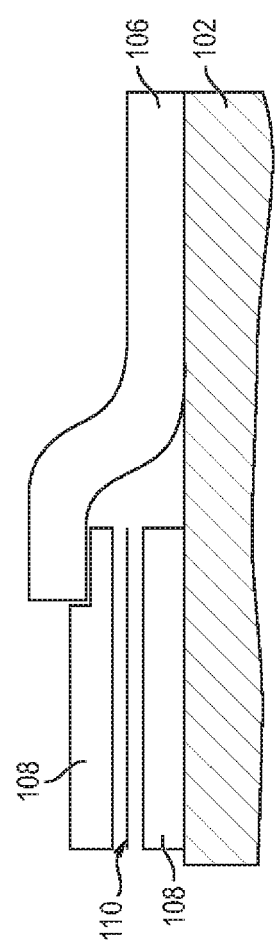
FIG. 1B is a schematic illustration of a graphene-insulating-superconducting junction, according to an embodiment of the present invention.
Figure 1C:
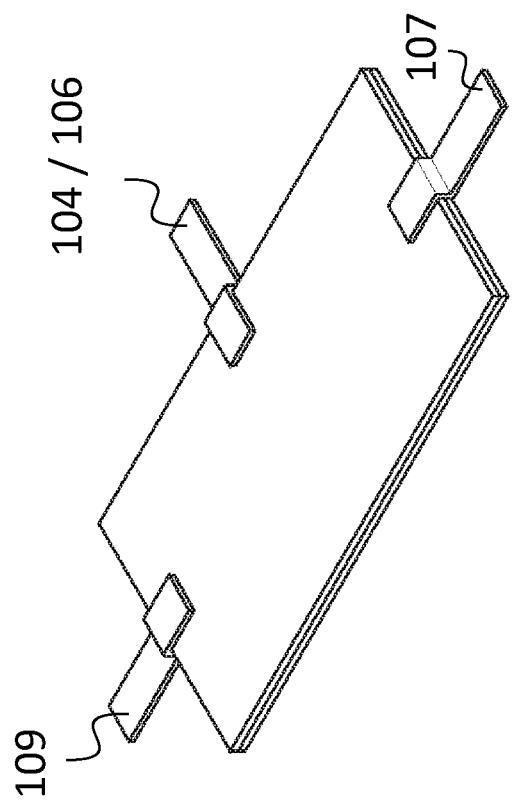
FIG. 1C is a schematic perspective view of a graphene-insulating-superconducting junction, according to an embodiment of the present invention.

FIG. 1B shows an embodiment in which the insulating portion of the graphene-insulating-superconducting junction 100 is not an additional element but is instead part of the upper hexagonal boron nitride layer 108, which is locally thinned to provide a suitable thickness for quantum tunneling. FIG. 1C is a perspective view in one embodiment, in which the combination of an insulating layer and superconducting metal layer (104/106), or a superconducting metal layer 106 (with a separate insulating element, as shown for example in FIG. 1B), forms a graphene-insulator-superconductor junction. The circuit can be closed by superconductor or metal contact 107, whereas the superconductor or metal contact 109 can be used for the coupling of the signal to be detected into the detector.

In operation, the junction may be cooled to a temperature at which the metal layer 106 is superconducting; the graphene sheet may remain normal (i.e., non-superconducting). Like other normal-insulating-superconducting junctions, the graphene-insulating-superconducting junction may exhibit a current-voltage characteristic that is diode-like; in particular the current through the junction may be proportional to the product of (i) the square root of the absolute temperature of the normal element (i.e., the graphene element) of the graphene-insulating-superconducting junction and (ii) an exponential function of (a) the voltage across the junction, divided by (b) the absolute temperature of the graphene element of the graphene-insulating-superconducting junction.

The electron temperature of the graphene sheet may be out of equilibrium with the temperature of the lattice of the graphene sheet. It is primarily the electron temperature that is affected by the absorption of microwave power, and it is primarily the electron temperature (not the temperature of the lattice) that influences the differential resistance of the graphene-insulating-superconducting junction (discussed in further detail below). Accordingly, the term "absolute temperature" as used herein refers to the absolute temperature of the electrons of the graphene element of the graphene-insulating-superconducting junction, i.e., the absolute temperature of the electrons of the graphene sheet.

In some embodiments, the temperature of the superconducting element of the graphene-insulating-superconducting junction does not significantly affect the current-voltage characteristic of the graphene-insulating-superconducting junction. As, such, when the graphene-insulating-superconducting junction is operated in a biased condition (e.g., with a bias voltage applied to the graphene-insulating-superconducting junction, resulting in a bias current flowing through the graphene-insulating-superconducting junction), the small signal resistance (or "differential resistance") of the graphene-insulating-superconducting junction is a function both of the bias voltage, and of the absolute electron temperature of the graphene element of the graphene-insulating-superconducting junction. In some embodiments, under suitable bias conditions, the differential resistance decreases with an increasing electron temperature in the graphene.

In some embodiments, microwave power is received (and absorbed) by the graphene sheet 110, resulting in an increase in the electron temperature of the graphene sheet 110, and a corresponding change in the differential resistance of the graphene-insulating-superconducting junction 100, which may be measured to infer the amount of microwave power received by the graphene-insulating-superconducting junction 100. The differential resistance may be measured, e.g., by a circuit such as that shown in FIGS. 2A and 2B.

Figure 2A:
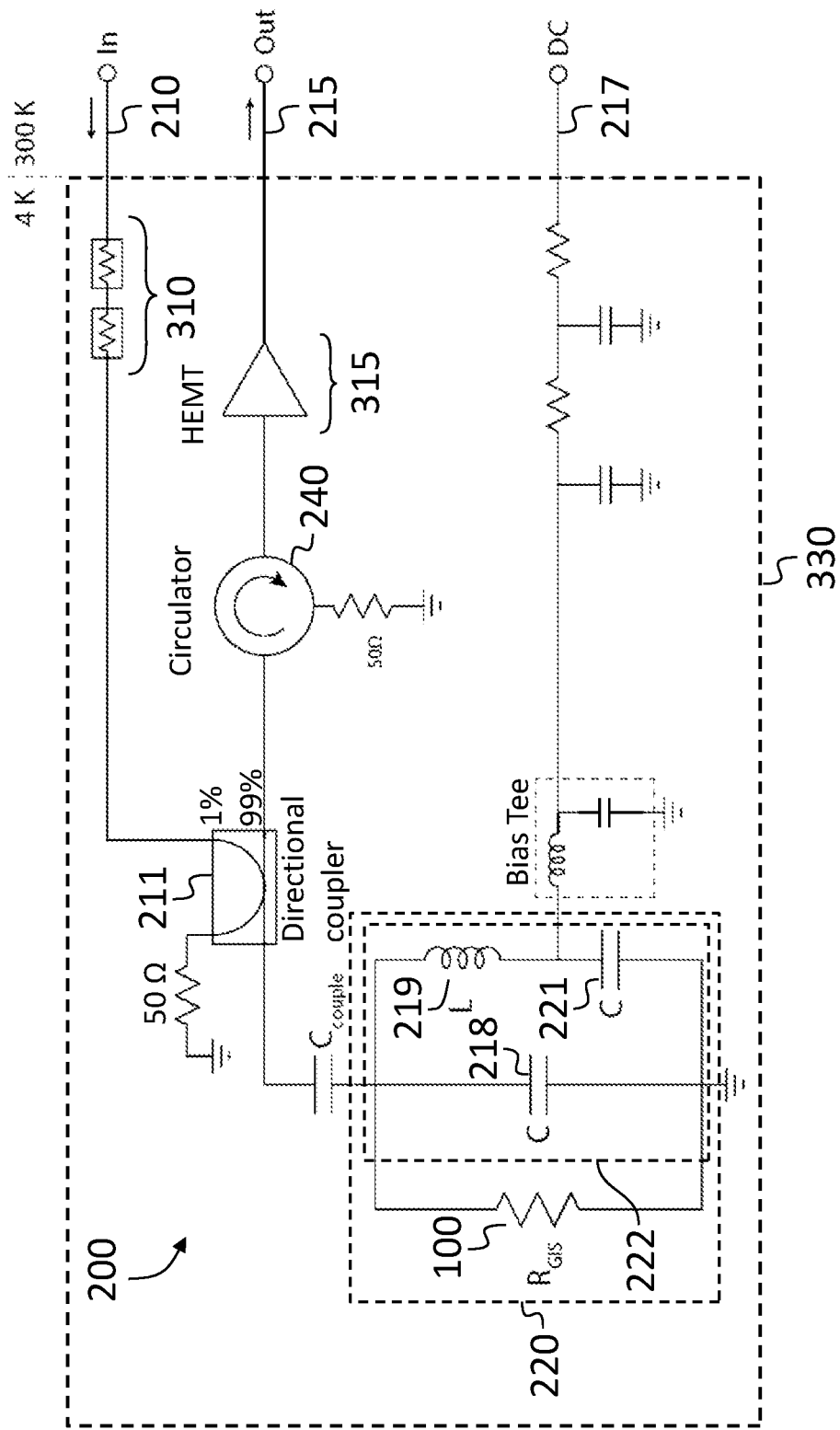
FIG. 2A is a schematic diagram of a sensor circuit, according to an embodiment of the present invention.

FIG. 2A shows a sensor circuit 200, which may be contained in, and kept at a low temperature (e.g., 4 K) by, a cryogenic system 330. A probe signal is received at a probe input 210, and partially transmitted, by a directional coupler 211 to the detection resonator, or "readout resonator" 220. The probe signal is partially reflected by the readout resonator 220 and the reflected probe signal is coupled, by the directional coupler 211, to the sensor circuit output 215. The amplitude and phase of the reflected probe signal may depend on the impedance of the readout resonator 220, and, therefore, on the differential resistance of the graphene-insulating-superconducting junction 100, which in turn may depend on the amount of microwave power (in the signal to be detected) received by the graphene-insulating-superconducting junction 100.

As such, the sensor circuit 200 may be employed to measure microwave power. For example, if the frequency of the probe signal is approximately equal to the resonant frequency of the readout resonator 220, then a change in the received microwave power may cause a change in the amplitude of the reflected probe signal; if the frequency of the probe signal is offset from the resonant frequency of the readout resonator 220, a change in the received microwave power may cause a change in the amplitude and a change in the phase of the reflected probe signal. The readout resonator 220 may have a resonant frequency between 10 MHz and 10 GHz, e.g., 1 GHz, and it may have a bandwidth that is approximately the reciprocal of the thermal response time of the (electron temperature of the) graphene sheet 110 (e.g., a bandwidth of approximately 1 GHz), so that the readout resonator 220 does not degrade the response time of the system.

A bias current, supplied through the bias (or "DC") input 217, flows through the graphene-insulating-superconducting junction 100. The readout resonator 220 includes the graphene-insulating-superconducting junction, connected in parallel with a tank circuit 222, which may consist of a resonator capacitor 218, a resonator inductor 219, and a blocking capacitor 221 (which may be sufficiently large to have a negligible effect on the frequency response of the tank circuit 222), as shown. As used herein, a "tank circuit" is the parallel combination of an inductor and a capacitor, or such a circuit including other elements (such as the large blocking capacitor 221) that do not significantly affect its resonant characteristics. In some embodiments the readout resonator is configured differently; for example, it may consist of the graphene-insulating-superconducting junction 100 coupled to a transmission line resonator (e.g., a quarter-wave resonator or a half-wave resonator). An input cascade 310 (which may include one or more attenuators) may be present (within the cryogenic system 330) on the input signal path, to attenuate noise (e.g., thermal noise) that may be received at the probe input 210, while adding thermal noise only at a level corresponding to the low temperature in the cryogenic system 330. This may reduce the extent to which such thermal noise may heat the graphene sheet 110.

A circulator 240 and an output cascade 315 may be present on the output path to reduce the extent to which noise generated by circuit elements connected to the sensor circuit output 215 may heat the graphene sheet 110. The output cascade 315 may include, connected in a cascade, zero or more attenuators, zero or more circulators, and zero or more amplifiers, to preserve the outbound radio frequency signal and to reduce both reflections back to the graphene-insulating-superconducting junction 100 and backward-propagating noise, either of which may, if not suppressed, heat the graphene sheet 110. The amplifiers may include one or more low-noise amplifiers, e.g., high electron mobility transistor (HEMT) amplifiers. In some embodiments a portion of the output cascade 315 is within the cryogenic system 330 and is kept at low temperature during operation, as shown in FIG. 2A. The output cascade 315 may also include amplifiers, such as a low noise amplifier 242 (FIG. 2B), which are outside the cryogenic system 330 (and which are therefore at room temperature, in operation), to further amplify the output signal and overcome the receiver electronics noise.

The blocking capacitor 221 may block the DC bias current which in the absence of this capacitor would flow directly to ground. The capacitance of the blocking capacitor 221 may be sufficiently large that at the resonant frequency of the readout resonator 220 the impedance of the blocking capacitor 221 is negligible compared to the impedance of the resonator capacitor 218, and negligible compared to the impedance of the resonator inductor 219. A coupling capacitor $C_{couple}$ may be connected in series with the readout resonator 220 as shown, to prevent bias current from flowing, e.g., through the directional coupler.

Figure 2B:
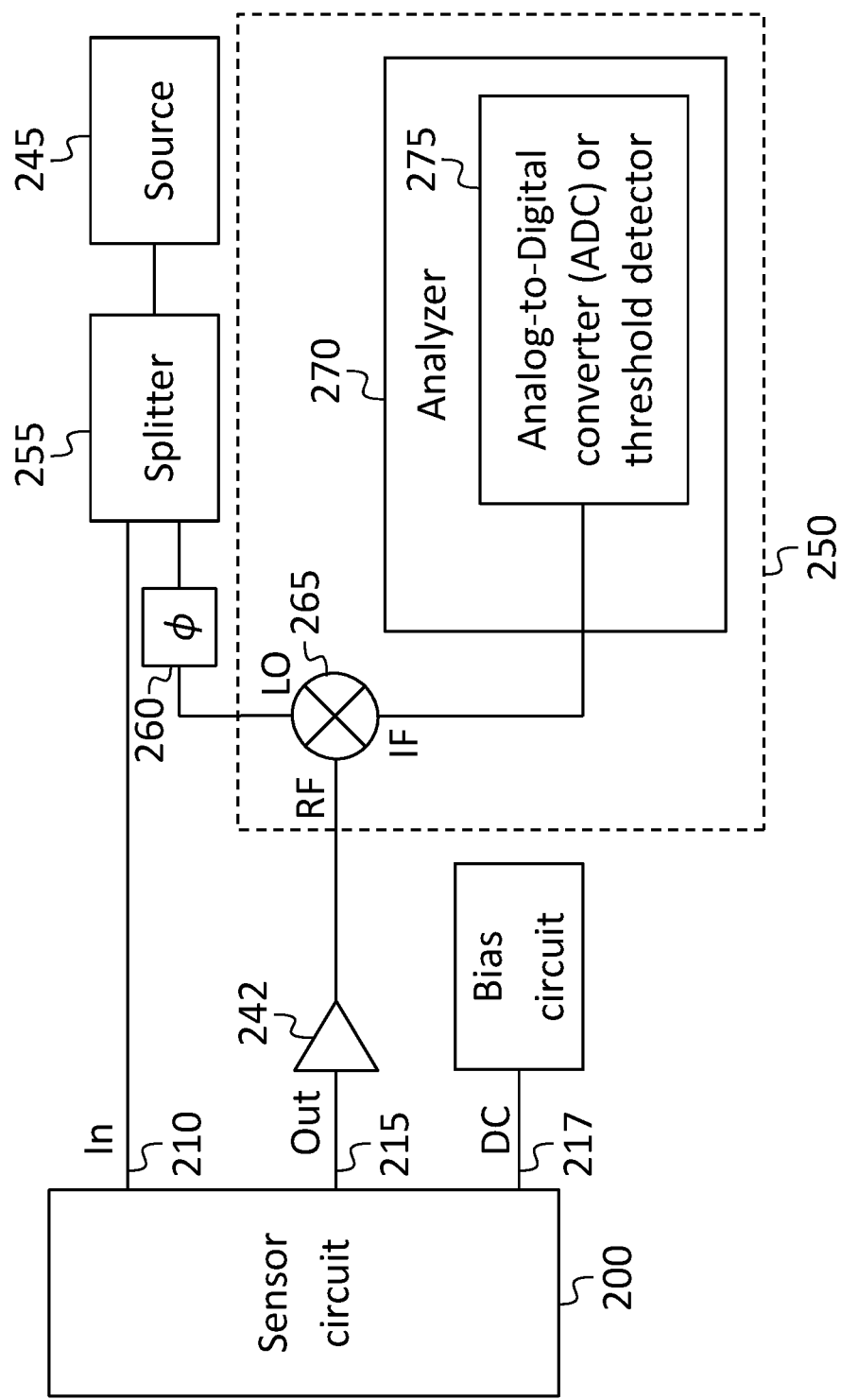
FIG. 2B is a schematic diagram of a microwave detector, according to an embodiment of the present invention.

FIG. 2B shows a circuit that may be used to measure the impedance of the readout resonator 220, and, thereby, the differential resistance of the graphene-insulating-superconducting junction 100 and the amount of microwave power received by the graphene-insulating-superconducting junction 100. A probe signal source 245 supplies the probe signal to the probe input 210, and the reflected signal is fed from the sensor circuit output 215 to a receiver 250. As such, the receiver 250 receives the probe signal, after reflection from the readout resonator 220 (and after transmission through various elements, including, for example, the directional coupler 211 and the output cascade 315).

A portion of the probe signal may be split off by a power splitter 255 as shown. The phase of this portion of the probe signal may be shifted by a phase shifter 260, and used as a local oscillator signal for the receiver 250. In the receiver 250, the local oscillator signal may be fed to the local oscillator ("LO") input of a mixer 265, the radio frequency ("RF") input of which is connected to the sensor circuit output 215 and the intermediate frequency ("IF") output of which is connected to an analyzer 270. As such, the analyzer receives the probe signal, after reflection from the readout resonator 220 and after frequency conversion by the mixer 265 (and after transmission through various elements, including, for example, the directional coupler 211 and the output cascade 315).

The analyzer 270 may include, e.g., an analog to digital converter (ADC) or threshold detector 275 and a processing circuit (discussed in further detail below) that may calculate the amplitude and phase of the reflected probe signal (e.g., from the DC signal at the IF output of the mixer for two different phase shifts applied by the phase shifter), and, from it, infer the impedance of the readout resonator 220, and the amount of microwave power received by the graphene-insulating-superconducting junction 100. The phase shifter may be controlled by the analyzer 270 (e.g., to alternate between values separated by 90 degrees). In other embodiments two mixers are used, each supplied with a respective local oscillator signal, the two local oscillator signals differing in phase by 90 degrees (so that together they may measure the in-phase and quadrature components of the reflected probe signal). In other embodiments, the power splitter 255 and the mixer 265 may be absent, and, for example, undersampling may be used to effect frequency downconversion, and a common frequency reference may be used by the probe signal source 245 and the processing circuit, to preserve phase coherence between the probe signal source 245 and the analyzer 270.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

In some embodiments the processing circuit may infer the temperature of the graphene sheet 110 based on only the magnitude of the impedance of the readout resonator 220; in other embodiments the processing circuit may use both the magnitude and the phase of the impedance of the readout resonator 220 to estimate the temperature. The relationship between the temperature and the amplitude and phase of the reflected probe signal may be derived analytically, or it may be measured, by adjusting the temperature (in the absence of microwave power received by the graphene-insulating-superconducting junction 100) and observing the amplitude and phase of the reflected probe signal.

In some embodiments changes in the differential resistance of the graphene-insulating-superconducting junction may be measured otherwise, for example, by applying a constant bias (voltage or current) to the graphene-insulating-superconducting junction and detecting (with an amplifier having sufficient bandwidth to resolve the thermal time constant of the graphene sheet) the changes in current or voltage that result when microwave power is absorbed by the graphene sheet.

Figure 3A:
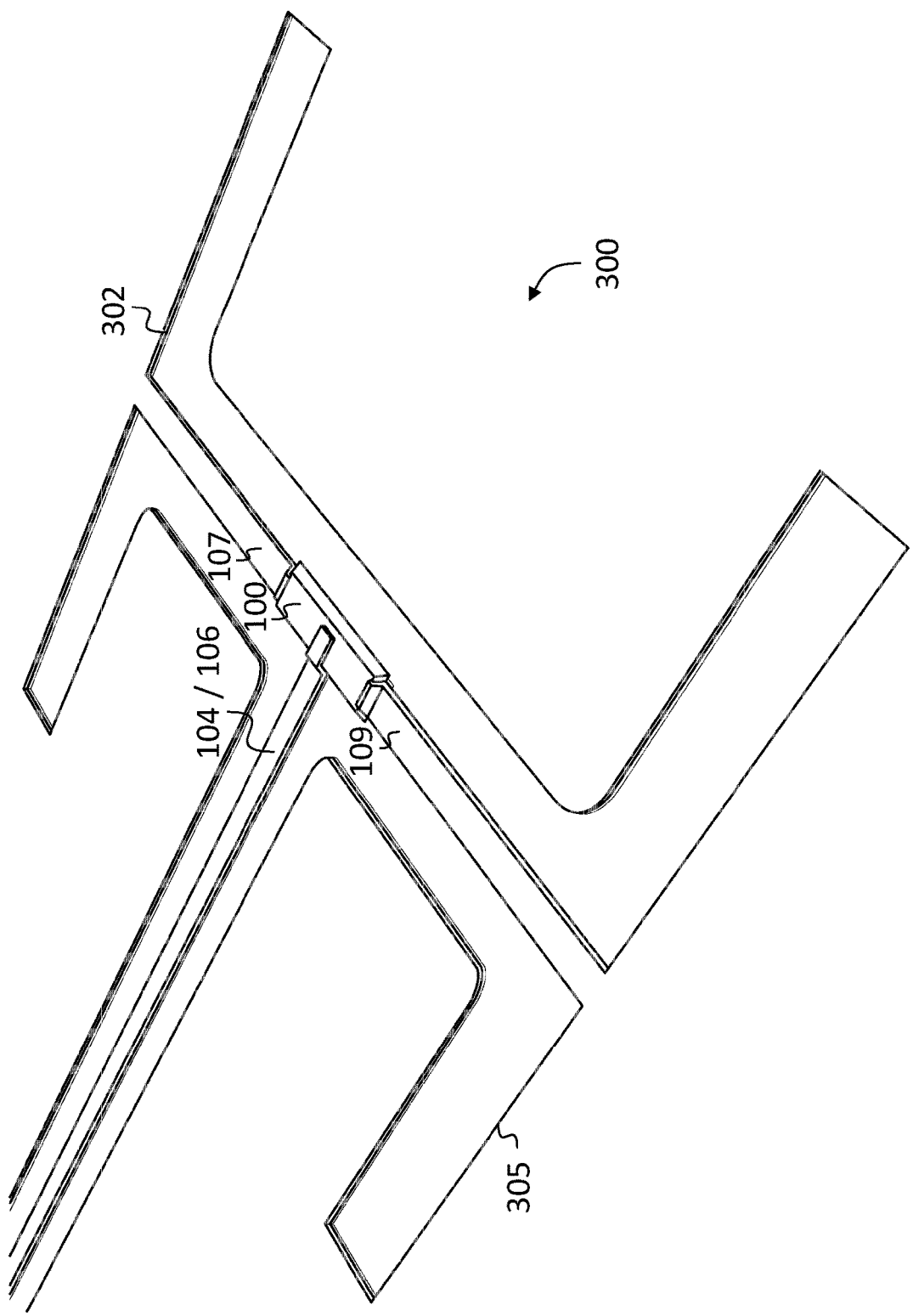
FIG. 3A is a perspective drawing of an input resonator, according to an embodiment of the present invention.

The microwave power to be measured may be coupled to the graphene-insulating-superconducting junction 100 in various ways, e.g., by a transmission line or waveguide connected to a microwave source, e.g., a receiving antenna. Referring to FIG. 3A, in some embodiments, a twin slot antenna (including a first slot 302 and a second slot 305), operates as an input resonator 300 to couple microwave radiation propagating in free space to (the edge contacts 107, 109 of) the graphene-insulating-superconducting junction 100.

Figure 3B:
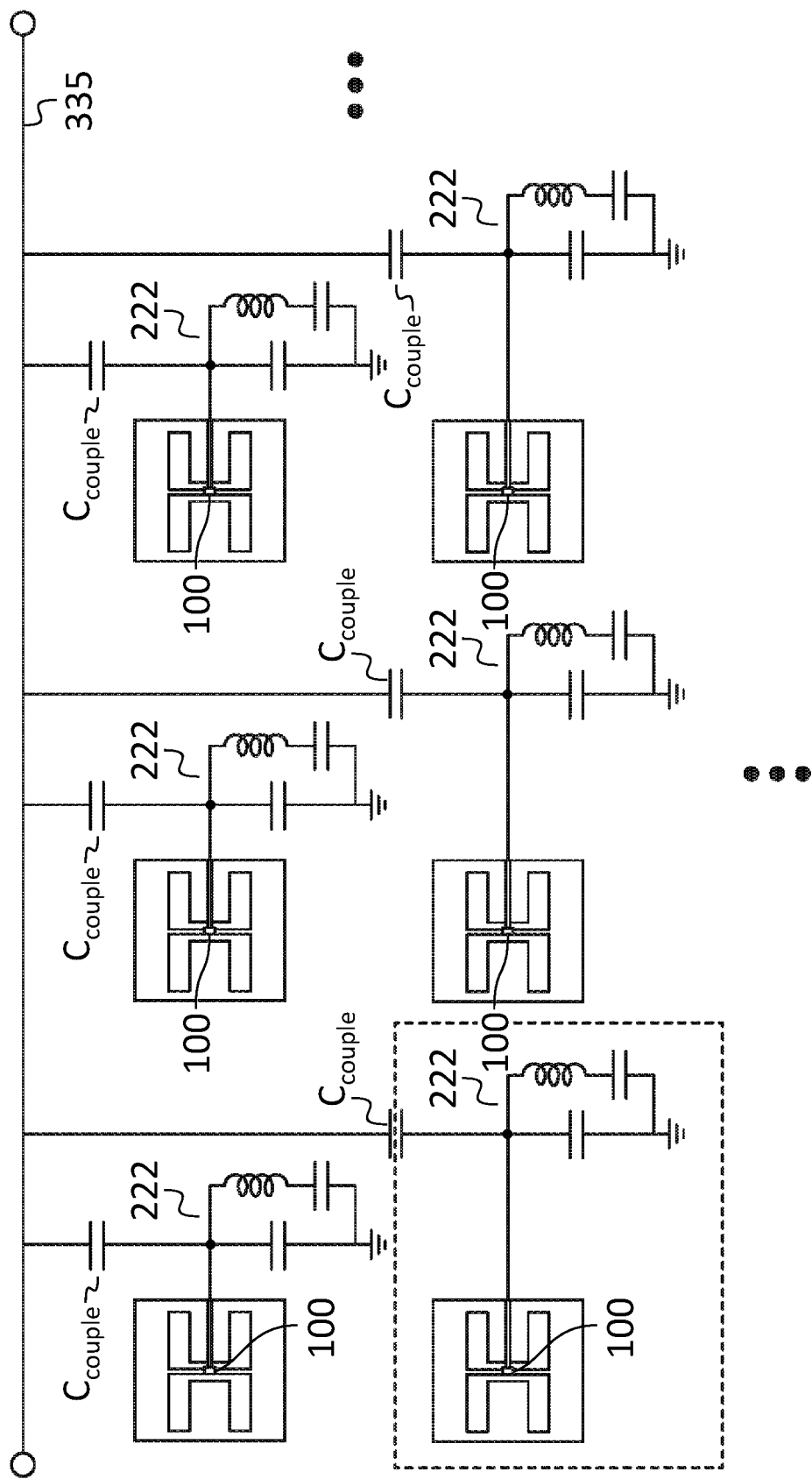
FIG. 3B is a schematic diagram of an array with frequency multiplexed readout, according to an embodiment of the present invention.

Referring to FIG. 3B, in some embodiments, a plurality of graphene-insulating-superconducting junctions 100, each coupled to a respective input resonator and each coupled to a respective tank circuit 222, may be arranged in an array (e.g., a two-dimensional array) as shown, having a common terminal 335. The array may be incorporated into a circuit like that of FIGS. 2A and 2B, being substituted, in that circuit, for the combination of the readout resonator 220 and the coupling capacitor $C_{couple}$. In such an embodiment, a frequency-multiplexed readout may be used. For example, the probe signal source may be a multi-frequency source, i.e., a signal source capable of operating at a plurality of frequencies (e.g., capable of producing a comb spectrum, or capable of switching between different frequencies), and the tank circuits 222 of the array may have different resonant frequencies, so that the respective differential resistance of each of the readout resonators 220 may be measured by measuring the amplitude or measuring the phase of the probe signal reflected at the corresponding frequency.

As used herein, the word "or" is inclusive, so that, for example, "A or B" means any one of (i) A, (ii) B, and (iii) A and B. As used herein, an "amplifier" is a circuit that amplifies, and, as such, an amplifier may include (e.g., consist of) a plurality of amplifiers connected in cascade. Similarly, an "attenuator" is a circuit that attenuates, and, as such, an attenuator may include (e.g., consist of) a plurality of attenuators connected in cascade. As used herein, when a first quantity is described as being "within X %" of a second quantity, it means that the first quantity is at least $1-X/100$ times the second quantity and at most $1+X/100$ times the second quantity. For example, if a first frequency is within 25% of 1 GHz, the first frequency is at least 0.75 GHz and at most 1.25 GHz. Although limited embodiments of a microwave detector have been specifically described and illustrated herein, many modifications and variations will be apparent to those skilled in the art. Accordingly, it is to be understood that a microwave detector employed according to principles of this invention may be embodied other than as specifically described herein. The invention is also defined in the following claims, and equivalents thereof.

What is claimed is:

1. A system for detecting microwave power, the system comprising:
   a first resonator comprising a graphene-insulating-superconducting junction;
   a probe signal source, coupled to the first resonator; and
   a probe signal analyzer,
   the probe signal analyzer being configured:
      to measure a change in amplitude or phase of a probe signal received by the probe signal analyzer from the probe signal source, and
      to infer, from the change in amplitude or phase, a change in microwave power received by the graphene-insulating-superconducting junction.

2. The system of claim 1, wherein the first resonator comprises a tank circuit.

3. The system of claim 1, wherein the probe signal analyzer is configured to measure a reflected probe signal, the reflected probe signal being reflected from the first resonator.

4. The system of claim 3, comprising a directional coupler connected to the probe signal source, the first resonator, and the probe signal analyzer, the directional coupler being configured:
   to transmit an incident probe signal from the probe signal source to the first resonator, and
   to transmit the reflected probe signal from the first resonator to the probe signal analyzer.

5. The system of claim 4, further comprising an amplifier between the directional coupler and the probe signal analyzer.

6. The system of claim 5, further comprising a circulator, between the first resonator and the amplifier.

7. The system of claim 4, further comprising an attenuator between the probe signal source and the directional coupler.

8. The system of claim 1, further comprising a bias circuit connected to the graphene-insulating-superconducting junction and configured to drive a bias current through the graphene-insulating-superconducting junction.

9. The system of claim 8, further comprising a bias tee, connected between the bias circuit and the graphene-insulating-superconducting junction.

10. The system of claim 8, further comprising a power splitter and a mixer, the power splitter being connected between the probe signal source and the first resonator, and configured to divert a portion of the probe signal from the probe signal source to a local oscillator input of the mixer, the mixer having a radio frequency input connected to the first resonator and an intermediate frequency output connected to the probe signal analyzer.

11. The system of claim 1, wherein the probe signal source is configured to provide an unmodulated signal at a first frequency, the first frequency being between 100 kHz and 100 GHz.

12. The system of claim 11, wherein the first frequency is within 10% of a resonant frequency of the first resonator when no microwave power is received by the graphene-insulating-superconducting junction.

13. The system of claim 12, wherein the probe signal analyzer is configured to measure a change in amplitude of the probe signal received by the probe signal analyzer from the probe signal source.

14. The system of claim 12, wherein the probe signal analyzer is configured:
to measure a change in phase of the probe signal received by the probe signal analyzer from the probe signal source and
to measure a change in amplitude of the probe signal received by the probe signal analyzer from the probe signal source.

15. The system of claim 1, comprising an array of resonators comprising the first resonator and a second resonator, wherein:
the second resonator comprises a graphene-insulating-superconducting junction;
the first resonator has a first resonant frequency;
the second resonator has a second resonant frequency different from the first resonant frequency; and
the probe signal source is a multi-frequency source, configured to operate at a frequency within 10% of the first resonant frequency and at a frequency within 10% of the second resonant frequency.

16. The system of claim 1, wherein:
the graphene-insulating-superconducting junction comprises a graphene sheet, and
the graphene-insulating-superconducting junction is configured to receive the microwave power as current flowing from a first edge contact of the graphene-insulating-superconducting junction, through the graphene sheet, to a second edge contact of the graphene-insulating-superconducting junction.

17. The system of claim 16, comprising a twin slot input resonator connected to the first edge contact and to the second edge contact.

18. The system of claim 16, wherein the graphene-insulating-superconducting junction comprises:
a first layer of hexagonal boron nitride immediately adjacent a first surface of the graphene sheet, and
a second layer of hexagonal boron nitride immediately adjacent a second surface of the graphene sheet.

19. The system of claim 18, wherein each of the first layer of hexagonal boron nitride and the second layer of hexagonal boron nitride has a thickness greater than 1 nm and less than 1 micron.

20. The system of claim 16, wherein the graphene sheet consists of a single atomic layer of graphene.

* * * * *